United States Patent
Ko et al.

(10) Patent No.: US 9,880,207 B2
(45) Date of Patent: Jan. 30, 2018

(54) PRECISE DETECTOR OF CHARGE CURRENT FOR CHARGE-DISCHARGE DEVICE

(71) Applicant: LG CHEM, LTD., Seoul (KR)

(72) Inventors: Joon Sang Ko, Daejeon (KR); Sang Wook Kang, Daejeon (KR); Jae Dong Chang, Daejeon (KR); Do Hun Kim, Daejeon (KR); Hyang Mok Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/916,365

(22) PCT Filed: May 21, 2014

(86) PCT No.: PCT/KR2014/004521
§ 371 (c)(1),
(2) Date: Mar. 3, 2016

(87) PCT Pub. No.: WO2015/046702
PCT Pub. Date: Apr. 2, 2015

(65) Prior Publication Data
US 2016/0202295 A1    Jul. 14, 2016

(30) Foreign Application Priority Data

Sep. 24, 2013    (KR) .......... 10-2013-0113106

(51) Int. Cl.
*G01R 1/20*    (2006.01)
*G01R 19/165*    (2006.01)
(Continued)

(52) U.S. Cl.
CPC ......... *G01R 19/165* (2013.01); *G01R 35/005* (2013.01); *G01R 35/007* (2013.01);
(Continued)

(58) Field of Classification Search
CPC .. G01R 1/203; G01R 15/146; G01R 19/0007; G01R 13/02; G01R 15/002; G01R 15/08;
(Continued)

(56) References Cited

U.S. PATENT DOCUMENTS 5,914,609 A    6/1999    Curry et al.
6,201,320 B1    3/2001    Gallavan
(Continued)

FOREIGN PATENT DOCUMENTS

CN    1216827 A    5/1999
CN    1232183 A    10/1999
(Continued)

OTHER PUBLICATIONS

KR 10-2013-0052065 Machine Translation (claims and description), Nov. 11, 2011.*
(Continued)

*Primary Examiner* — Huy Q Phan
*Assistant Examiner* — Raul Rios Russo
(74) *Attorney, Agent, or Firm* — Birch, Stewart, Kolasch & Birch, LLP

(57) ABSTRACT

Disclosed herein is a detector that detects precision in charging current of a battery cell charging and discharging device, the detector including an instrument unit and a power supply unit, wherein the instrument unit includes a housing formed in a box shape open at a top thereof and a plurality of voltage measurement parts including a pair of connection terminals mounted at opposite sides of the housing inside the housing to detect precision in current of the charging and discharging device, the connection terminals being electrically connected to the power supply unit, and shunt resistance parts to apply uniform resistance to the respective connection terminals, and the power supply unit includes a charging and discharging device to supply current
(Continued)

to the voltage measurement parts and to charge and discharge a battery cell and a multi-meter to measure current and voltage of the shunt resistance parts.

11 Claims, 6 Drawing Sheets

(51) Int. Cl.
  *G01R 35/00*   (2006.01)
  *H02J 7/00*   (2006.01)
  *H01M 10/48*   (2006.01)
  *G01R 31/36*   (2006.01)

(52) U.S. Cl.
  CPC .......... *H01M 10/48* (2013.01); *H02J 7/0042* (2013.01); *H02J 7/0068* (2013.01); *G01R 1/203* (2013.01); *G01R 31/36* (2013.01); *G01R 31/3631* (2013.01); *H02J 7/0021* (2013.01)

(58) Field of Classification Search
  CPC ...... G01R 15/09; G01R 15/125; G01R 17/04; G01R 19/165; G01R 19/1659
  USPC ............. 324/72, 76.11–76.83, 115, 126, 149
  See application file for complete search history.

(56) References Cited

U.S. PATENT DOCUMENTS

| | | | | |
|---|---|---|---|---|
| 2005/0264263 | A1* | 12/2005 | Tsenter | H02J 7/0072 320/128 |
| 2006/0012372 | A1* | 1/2006 | Emori | H02J 7/0016 324/413 |
| 2008/0088276 | A1* | 4/2008 | Hurst | H01M 10/0481 320/116 |
| 2008/0090139 | A1* | 4/2008 | Hurst | H01M 2/1016 429/156 |
| 2012/0119749 | A1 | 5/2012 | Iida | |
| 2013/0200700 | A1* | 8/2013 | Ohkura | H01M 2/206 307/10.7 |

FOREIGN PATENT DOCUMENTS

| | | |
|---|---|---|
| CN | 101071949 A | 11/2007 |
| CN | 101373902 A | 2/2009 |
| CN | 101842958 A | 9/2010 |
| CN | 102472802 A | 5/2012 |
| CN | 102638071 A | 8/2012 |
| EP | 0913698 A1 | 5/1999 |
| JP | 4-291168 A | 10/1992 |
| JP | 2000-156938 A | 6/2000 |
| JP | 2013-148459 A | 8/2013 |
| KR | 10-2008-0050643 A | 6/2008 |
| KR | 10-2009-0044936 A | 5/2009 |
| KR | 10-2012-0091833 A | 8/2012 |
| KR | 10-2013-0052065 A | 5/2013 |
| TW | 420752 B | 2/2001 |
| WO | WO 2013/128987 A1 | 9/2013 |

OTHER PUBLICATIONS

KR 10-2012-0091833 Machine Translation, Feb. 10, 2011.*
WO 2013128987 Machine Translation, Jan. 3, 2012.*
International Search Report, issued in PCT/KR2014/004521, dated Jul. 11, 2014.

* cited by examiner

[FIG. 1]
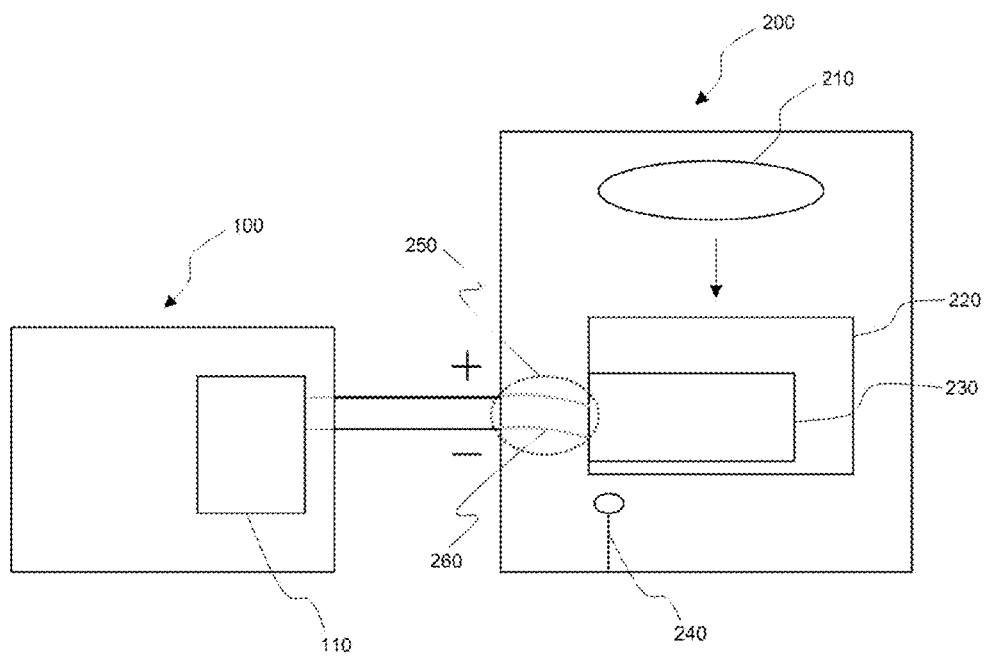
[FIG. 2]
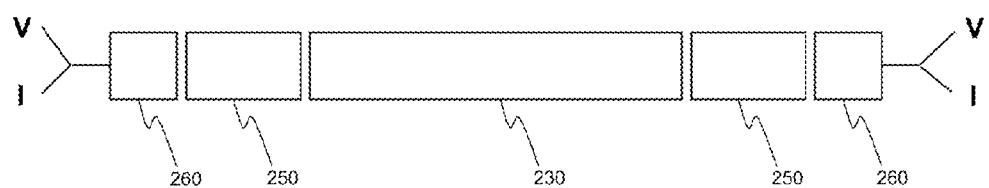

[FIG. 3]
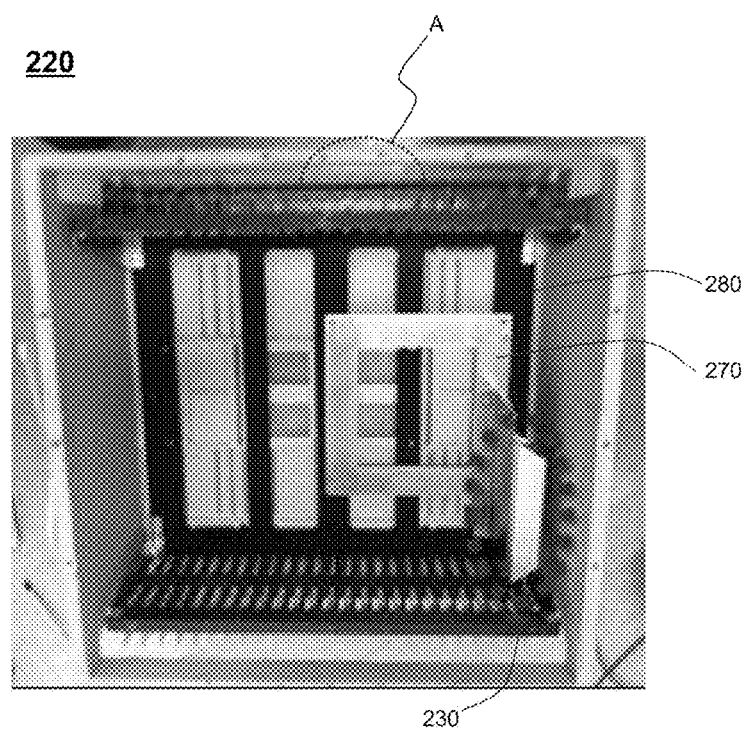

[FIG. 4]
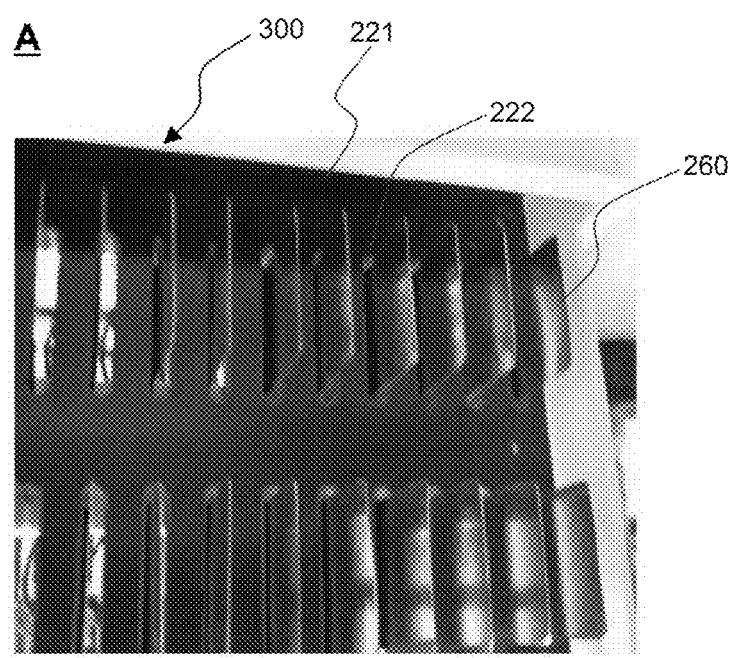

[FIG. 5]
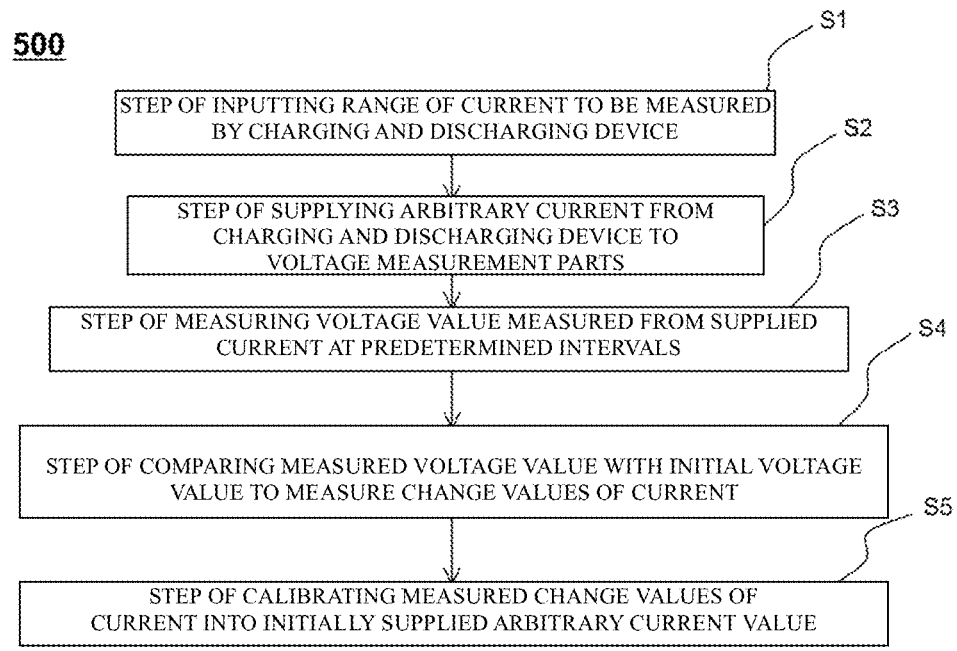

[FIG. 6]
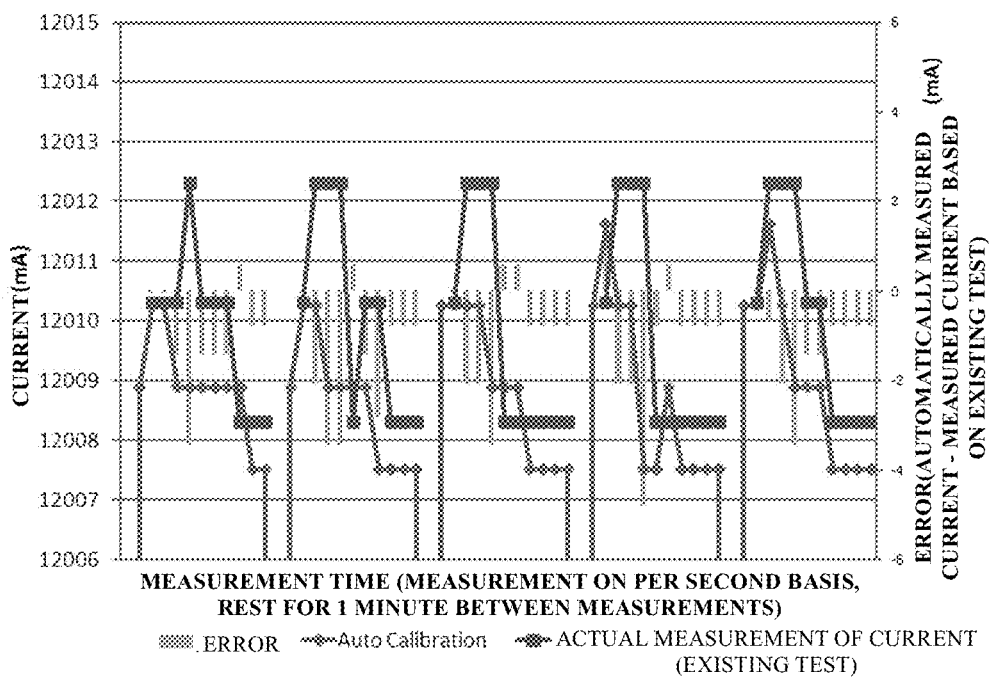

[FIG. 7]
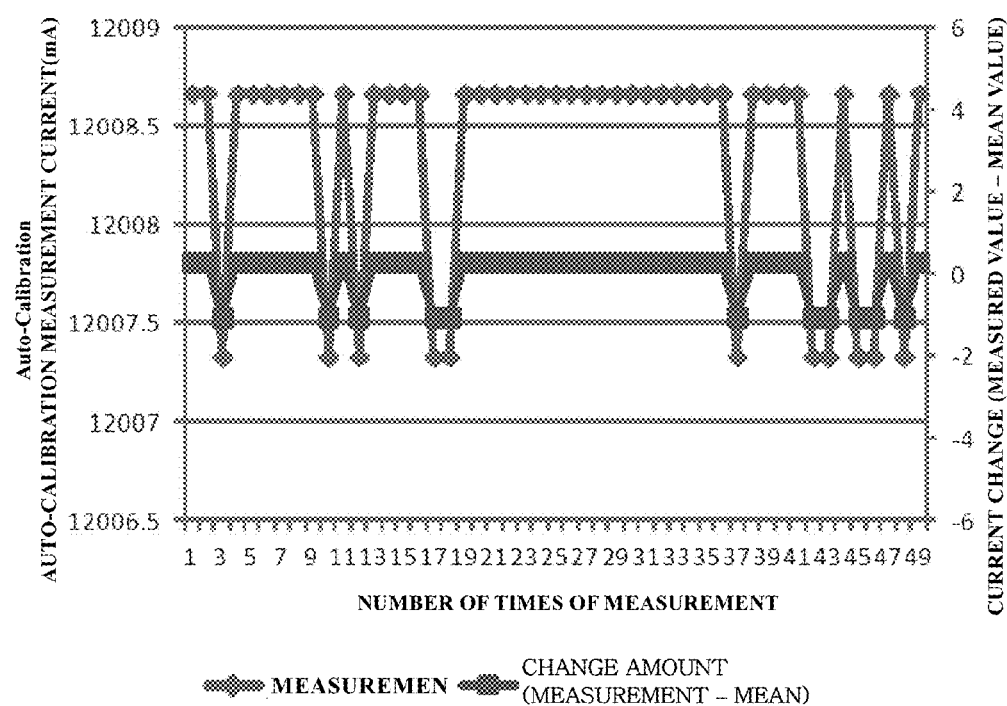

PRECISE DETECTOR OF CHARGE CURRENT FOR CHARGE-DISCHARGE DEVICE

TECHNICAL FIELD

The present invention relates to a detector that detects precision in charging current of a battery cell charging and discharging device, the detector including an instrument unit and a power supply unit, wherein the instrument unit includes a housing formed in a box shape open at a top thereof and a plurality of voltage measurement parts including a pair of connection terminals mounted at opposite sides of the housing inside the housing to detect precision in current of the charging and discharging device, the connection terminals being electrically connected to the power supply unit, and shunt resistance parts to apply uniform resistance to the respective connection terminals, and the power supply unit includes a charging and discharging device to supply current to the voltage measurement parts and to charge and discharge a battery cell and a multi-meter to measure current and voltage of the shunt resistance parts.

BACKGROUND ART

As mobile devices have been increasingly developed and the demand for such mobile devices has increased, the demand for batteries has also sharply increased as an energy source for the mobile devices. Accordingly, much research on batteries satisfying various needs has been carried out.

In terms of the shape of batteries, the demand for prismatic secondary batteries or pouch-shaped secondary batteries, which are thin enough to be applied to products, such as mobile phones, is very high. In terms of the material for batteries, on the other hand, the demand for lithium secondary batteries, such as lithium ion batteries and lithium ion polymer batteries, having high energy density, discharge voltage, and output stability, is very high As energy density and capacity of the secondary battery have been greatly increased, however, a larger amount of heat is generated from the secondary battery during repetitive charge and discharge of the secondary battery and, therefore, the temperature of the secondary battery is excessively increased. As a result, a device may malfunction and operation efficiency of the device may be lowered. In addition, the lifespan of the secondary battery may be greatly reduced.

For this reason, a great number of tests are carried out for products in order to secure optimal operation and safety of the battery. A process of measuring an electrochemical operation state, such as voltage and current, and a physical operation state, such as temperature and pressure, of a test sample using a battery charging and discharging device is included in the tests.

A conventional charging and discharging device has no problem in a case in which current precision of one facility is measured. In a case in which several charging and discharging facilities are to be measured in a limited space, however, precision of the charging and discharging device is greatly lowered due to many internal resistance elements. As a result, precision in charging current of a battery cell is also reduced.

Therefore, there is a high necessity for an apparatus, having a compact size with improved spatial efficiency, which is capable of periodically inspecting precision in charging current of the charging and discharging device.

In addition, there is a high necessity of an inspecting apparatus that is capable of sorting defects of the charging and discharging device before the defects of the charging and discharging device are generated.

DISCLOSURE

Technical Problem

Therefore, the present invention has been made to solve the above problems, and other technical problems that have yet to be resolved.

As a result of a variety of extensive and intensive studies and experiments to solve the problems described above, the inventors of the present applications have found that, in a case in which a detector that detects precision in charging current of a charging and discharging device to measure current of a plurality of battery cells is configured to have a specific structure, it is possible to secure reliability of the charging and discharging device and to greatly reduce a defect rate in a manufacturing process of the battery cells. The present invention has been completed based on these findings.

Technical Solution

In accordance with one aspect of the present invention, the above and other objects can be accomplished by the provision of a detector that detects precision in charging current of a battery cell charging and discharging device, the detector including an instrument unit and a power supply unit, wherein the instrument unit includes a housing formed in a box shape open at a top thereof and a plurality of voltage measurement parts including a pair of connection terminals mounted at opposite sides of the housing inside the housing to detect precision in current of the charging and discharging device, the connection terminals being electrically connected to the power supply unit, and shunt resistance parts to apply uniform resistance to the respective connection terminals, and the power supply unit includes a charging and discharging device to supply current to the voltage measurement parts and to charge and discharge a battery cell and a multi-meter to measure current and voltage of the shunt resistance parts.

As described above, the detector according to the present invention is configured to have a specific structure in which the detector that detects precision in charging current of the charging and discharging device is divided into the power supply unit and the instrument unit to measure current of a plurality of batter cells. Consequently, it is possible to greatly improve precision in charging current of the charging and discharging device while simplifying the equipment.

In addition, the detector according to the present invention may be configured to have a structure in which the shunt resistance parts are directly mounted at the connection terminals without additional connection members. Consequently, it is possible to remove internal resistance elements, thereby securing precision in charging current.

A detector that detects charging current of a charging and discharging device has not been proposed. That is, the detector according to the present invention is novel.

Shunt resistance is a general term for metal resistance used to measure voltage and to convert the measured voltage into a current value in a case in which it is difficult to directly measure current.

The shunt resistance parts are connected to tabs, which are direct current loads, in series. The shunt resistance parts are connected to a positive (+) terminal or a negative (−) terminal to perform measurement. For example, in a case in which a voltage of 50 mV is measured for a shunt resistance part of 5 mΩ, the voltage is converted into a current value of 5 A according to Ohm's law.

In a preferred example, the number of the voltage measurement parts may be 30 to 100. For example, 25 voltage measurement parts may be formed at the left side of a tray and 25 voltage measurement parts may be formed at the right side of the tray.

Consequently, the voltage measurement parts can simultaneously detect precision in voltage for a plurality of channels.

Specifically, results of experiments carried out by the inventors of the present application reveal that it takes two hours or more to measure charging voltage of 50 battery cells in a case in which the charging and discharging device has only one channel, whereas it takes one minute or less to measure charging voltage of 50 battery cells in a case in which the charging and discharging device has 50 channels.

In another preferred example, each of the connection terminals may be made of a metal plate having an outer surface plated with gold to improve conductivity. In this case, resistance is minimized when the charging and discharging device supplies current to the connection terminals, thereby greatly improving precision in detected voltage.

In the above structure, the shape of the metal plate is not particularly restricted so long as it is possible to improve conductivity. For example, the metal plate may be formed in a quadrangular shape in horizontal section.

In another example, the charging and discharging device may include channels, the number of which corresponds to the number of the voltage measurement parts. The number of the channels may be increased or decreased as needed.

In addition, the shunt resistance parts are sensitive to temperature. For this reason, the instrument unit may further include a thermometer and a cooling fan.

Consequently, it is possible to uniformly maintain heat generated due to supply of current, thereby preventing delay of time necessary for cooling.

In a preferred example, the current supplied to the voltage measurement parts may be 12 A.

Meanwhile, the instrument unit may further include a frame having through holes, through which the connection terminals are inserted and fixed. The number of the through holes may correspond to the number of the connection terminals.

The battery cell may be a lithium ion battery or a lithium ion polymer battery. However, the present invention is not limited thereto.

In accordance with another aspect of the present invention, there is provided a method of detecting charging current of the battery cell charging and discharging device using the detector with the above-stated construction.

Specifically, the detecting method includes (a) inputting a range of current to be measured by the charging and discharging device, (b) supplying arbitrary current from the charging and discharging device to the voltage measurement parts, (c) measuring a voltage value measured from the supplied current at predetermined intervals, (d) comparing the measured voltage value with an initial voltage value to measure change values of current, and (e) calibrating the measured change values of current into an initially supplied arbitrary current value.

In a concrete example, the step (c) may include continuously measuring the voltage value for 10 times at 1-second intervals.

Effects of the Invention

As is apparent from the above description, the detector that detects precision in charging current of the battery cell charging and discharging device according to the present invention is configured to have a specific structure. Consequently, it is possible to accurately measure precision in charging current of the battery cells, thereby securing reliability of the charging and discharging device and greatly reducing a defect rate of the battery cells.

In addition, the detector according to the present invention is configured to have an efficient structure in a limited space. Consequently, it is possible to mass-produce the detector.

BRIEF DESCRIPTION OF DRAWINGS

The above and other objects, features and other advantages of the present invention will be more clearly understood from the following detailed description taken in conjunction with the accompanying drawings, in which:

FIG. 1 is a typical view showing a detector according to an embodiment of the present invention;

FIG. 2 is a schematic conceptual view of the detector according to the embodiment of the present invention;

FIG. 3 is a photo showing the detector according to the embodiment of the present invention;

FIG. 4 is an enlarged photo showing the rear of part A of FIG. 3;

FIG. 5 is a flowchart showing a detection method according to an embodiment of the present invention;

FIG. 6 is a graph showing comparison between a current value according to an example of the present invention and a current value according to a comparative example; and FIG. 7 is a graph showing change of the current value according to the example of the present invention.

DETAILED DESCRIPTION OF THE INVENTION

Now, exemplary embodiments of the present invention will be described in detail with reference to the accompanying drawings. It should be noted, however, that the scope of the present invention is not limited by the illustrated embodiments.

FIG. 1 is a typical view showing a detector according to an embodiment of the present invention and FIG. 2 is a schematic conceptual view of the detector according to the embodiment of the present invention.

Referring to these drawings, the detector according to the embodiment of the present invention includes an instrument unit 200 including a housing 220 to receive battery cells and voltage measurement parts 300, a charging and discharging device to apply voltage to the voltage measurement unit 300, and a multi-meter.

Specifically, the instrument unit 200 includes a housing 220 formed in a box shape open at the top thereof and voltage measurement parts 300 including connection terminals 260 mounted at opposite sides of the housing 220 inside the housing 220 to detect precision in current of a charging and discharging device, the connection terminals 260 being electrically connected to a power supply unit 100, which will hereinafter be described, and shunt resistance parts 230 to apply uniform resistance to the respective connection terminals 260.

The power supply unit 100 includes a charging and discharging device (not shown) to supply current to the voltage measurement parts 300 and to charge and discharge battery cells and a multi-meter 110 to measure current and voltage of the shunt resistance parts 230.

FIG. 3 is a photo showing the detector according to the embodiment of the present invention and FIG. 4 is an enlarged photo showing part A of FIG. 3.

Referring to these drawings, the voltage measurement parts 300 of the instrument unit 200 according to the embodiment of the present invention are mounted at the left and right sides of the housing 220 inside the housing 220 such that 25 voltage measurement parts 300 are mounted at the left side of the housing 220 and 25 voltage measurement parts 300 are mounted at the right side of the housing 220. The instrument unit 200 includes a frame 221 having through holes 222, through which the connection terminals 260 are inserted and fixed.

In addition, a fixing plate 280 to fix the left voltage measurement parts 300 and the right voltage measurement parts 300 is mounted at the lower end of the housing 220. The shunt resistance parts 230 are directly mounted at the connection terminals 260 of the battery cells.

As described above, the internal components are removed or arranged to remove elements generating internal resistance. Even in a case in which a plurality of battery cells is simultaneously measured, therefore, it is possible to secure precision in current and voltage measurement without errors.

FIG. 5 is a flowchart typically showing a detection method according to an embodiment of the present invention.

Referring to FIG. 5 together with FIGS. 1 to 4, the detection method 500 includes a step of inputting a range of current to be measured by the charging and discharging device (S1), a step of supplying arbitrary current from the charging and discharging device to the voltage measurement parts (S2), a step of measuring a voltage value measured from the supplied current at predetermined intervals (S3), a step of comparing the measured voltage value with an initial voltage value to measure change values of current (S4), and a step of calibrating the measured change values of current into an initially supplied arbitrary current value (S5).

In a concrete example, a current of 12 A may be supplied for 10 seconds at step S2; however, the present invention is not limited thereto. According to circumstances, the supplied current is not particularly restricted so long as an error due to the amount of generated heat does not occur in a relationship between shunt resistance and voltage. In addition, the current supply time (10 seconds) may be changed so long as it is possible to stably measure current and voltage.

At step S3, the voltage value may be continuously measured for 10 times at 1-second intervals in order to reduce a deviation in measured values.

FIG. 6 is a graph showing comparison between a current value supplied to the detector according to the embodiment of the present invention and a current value according to a comparative example and FIG. 7 is a graph showing change of a current value according to an example of the present invention.

Hereinafter, the present invention will be described in more detail based on examples; however, the following examples are given only to illustrate the present invention and, therefore, the scope of the present invention is not limited to the examples.

EXAMPLE

Shunt resistance parts of a detector were directly connected to connection terminals of battery cells, a voltage range of −5V to 5V was set using a charging and discharging device, a current of 12 A was supplied, a shunt resistance value was set to 150 uOhm (current*resistance=1.8V), and current change values of the battery cells were repeatedly measures 5 times.

Comparative Example

Current change values of the battery cells were measured using the same method as in the example except that the shunt resistance parts of the detector were connected to the connection terminals of the battery cells via additional wires.

Experimental Example 1

The current change values according to the example were compared with the current change values according to the comparative example. The results are shown in Table 1 below. FIG. 6 shows the current change values according to the example and the comparative example and error values.

TABLE 1

| Order | Example (unit: mA) | Comparative example (unit: mA) | Error (unit: mA) |
| --- | --- | --- | --- |
| 1 | 12010.26 | 12010.31856 | −0.058555402 |
|  | 12010.26 | 12010.31856 | −0.058555402 |
|  | 12008.89333 | 12010.31856 | −1.425222069 |
|  | 12008.89333 | 12012.31828 | −3.424942108 |
|  | 12008.89333 | 12010.31856 | −1.425222069 |
|  | 12008.89333 | 12010.31856 | −1.425222069 |
|  | 12008.89333 | 12010.31856 | −1.425222069 |
|  | 12008.89333 | 12008.31884 | 0.57449797 |
|  | 12007.52667 | 12008.31884 | −0.792168696 |
|  | 12007.52667 | 12008.31884 | −0.792168696 |
| 2 | 12010.26 | 12010.31856 | −0.058555402 |
|  | 12010.26 | 12012.31828 | −2.058275441 |
|  | 12008.89333 | 12012.31828 | −3.424942108 |
|  | 12008.89333 | 12012.31828 | −3.424942108 |
|  | 12008.89333 | 12008.31884 | 0.57449797 |
|  | 12008.89333 | 12010.31856 | −1.425222069 |
|  | 12007.52667 | 12010.31856 | −2.791888736 |
|  | 12007.52667 | 12008.31884 | −0.792168696 |
|  | 12007.52667 | 12008.31884 | −0.792168696 |
|  | 12007.52667 | 12008.31884 | −0.792168696 |
| 3 | 12010.26 | 12010.31856 | −0.058555402 |
|  | 12010.26 | 12012.31828 | −2.058275441 |
|  | 12010.26 | 12012.31828 | −2.058275441 |
|  | 12008.89333 | 12012.31828 | −3.424942108 |
|  | 12008.89333 | 12008.31884 | 0.57449797 |
|  | 12008.89333 | 12008.31884 | 0.57449797 |
|  | 12007.52667 | 12008.31884 | −0.792168696 |
|  | 12007.52667 | 12008.31884 | −0.792168696 |
|  | 12007.52667 | 12008.31884 | −0.792168696 |
| 4 | 12011.62 | 12010.31856 | 1.301444598 |
|  | 12010.26 | 12012.31828 | −2.058275441 |
|  | 12010.26 | 12012.31828 | −2.058275441 |
|  | 12007.52667 | 12012.31828 | −4.791608775 |
|  | 12007.52667 | 12008.31884 | −0.792168696 |
|  | 12008.89333 | 12008.31884 | 0.57449797 |
|  | 12007.52667 | 12008.31884 | −0.792168696 |
|  | 12007.52667 | 12008.31884 | −0.792168696 |
|  | 12007.52667 | 12008.31884 | −0.792168696 |
|  | 12007.52667 | 12008.31884 | −0.792168696 |
| 5 | 12010.26 | 12010.31856 | −0.058555402 |
|  | 12011.62 | 12012.31828 | −0.698275441 |
|  | 12010.26 | 12012.31828 | −2.058275441 |
|  | 12008.89333 | 12012.31828 | −3.424942108 |
|  | 12008.89333 | 12010.31856 | −1.425222069 |
|  | 12008.89333 | 12010.31856 | −1.425222069 |
|  | 12007.52667 | 12008.31884 | −0.792168696 |
|  | 12007.52667 | 12008.31884 | −0.792168696 |
|  | 12007.52667 | 12008.31884 | −0.792168696 |
|  | 12007.52667 | 12008.31884 | −0.792168696 |

It can be seen from Table 1 above that the change range of the current values is less than about 2.9 mA in the example, whereas the change range of the current values is about 3.9 mA or more in the comparative example. Therefore, it can be seen that a difference between the error ranges is −3 mA or more.

Experimental Example 2

Precision in current of the example was repeatedly measured a total of 49 times. The results are shown in Table 2 below and FIG. 7.

TABLE 2

| Order | Measured value range (mA) | Change value range (Measured value − mean value) (mA) |
|---|---|---|
| 1 to 49 | 12007.33 to 12008.67 | −1.034013605 to 0.299319728 |

It can be seen from Table 2 above and FIG. 7 that an error range of the current values is −1 mA to 1 mA even when precision in current is repeatedly measured a plurality of times in a state in which the same current value (12 A) is supplied. That is, similar result values are obtained and, therefore, it can be seen that precision in current is secured.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A detector that detects precision in charging current of a battery cell charging and discharging device, the detector comprising:
   an instrument unit and a power supply unit,
   wherein the instrument unit comprises:
      a housing formed in a box shape open at a top thereof; and
      a plurality of voltage measurement parts comprising a pair of connection terminals mounted at opposite sides of the housing inside the housing to detect precision in current of the charging and discharging device, the connection terminals being electrically connected to the power supply unit, and shunt resistance parts to apply uniform resistance to the respective connection terminals,
   wherein the power supply unit comprises a charging and discharging device to supply current to the voltage measurement parts and to charge and discharge a battery cell and a multi-meter to measure current and voltage of the shunt resistance parts, and
   wherein the shunt resistance parts are directly mounted at the connection terminals without additional connection members.

2. The detector according to claim 1, wherein the number of the voltage measurement parts is 30 to 100.

3. The detector according to claim 1, wherein each of the connection terminals is made of a metal plate having an outer surface plated with gold to improve conductivity.

4. The detector according to claim 3, wherein the metal plate is formed in a quadrangular shape in horizontal section.

5. The detector according to claim 1, wherein the charging and discharging device comprises channels, the number of which corresponds to the number of the voltage measurement parts.

6. The detector according to claim 1, wherein the instrument unit further comprises a thermometer and a cooling fan.

7. The detector according to claim 1, wherein the current supplied to the voltage measurement parts is 12 A.

8. The detector according to claim 1, wherein the instrument unit further comprises a frame having through holes, through which the connection terminals are inserted and fixed.

9. The detector according to claim 1, wherein the battery cell is a lithium secondary battery.

10. A method of detecting charging current of the battery cell charging and discharging device using the detector according to claim 1, comprising:
   (a) inputting a range of current to be measured by the charging and discharging device;
   (b) supplying arbitrary current from the charging and discharging device to the voltage measurement parts;
   (c) measuring a voltage value measured from the supplied current at predetermined intervals;
   (d) comparing the measured voltage value with an initial voltage value to measure change values of current; and
   (e) calibrating the measured change values of current into an initially supplied arbitrary current value.

11. The detection method according to claim 10, wherein the step (c) comprises continuously measuring the voltage value for 10 times at 1-second intervals.

* * * * *